(12) United States Patent
Chang et al.

(10) Patent No.: US 10,909,914 B2
(45) Date of Patent: Feb. 2, 2021

(54) DISPLAY DEVICE AND DRIVING METHOD THEREOF HAVING A DISPLAY AREA IN A PERIPHERAL REGION

(71) Applicant: InnoLux Corporation, Miao-Li County (TW)

(72) Inventors: Geng-Fu Chang, Miao-Li County (TW); Jui-Feng Ko, Miao-Li County (TW); Tsau-Hua Hsieh, Miao-Li County (TW); Chun-Hsien Lin, Miao-Li County (TW); Jian-Jung Shih, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/131,123

(22) Filed: Sep. 14, 2018

(65) Prior Publication Data
US 2019/0114961 A1    Apr. 18, 2019

Related U.S. Application Data

(60) Provisional application No. 62/571,343, filed on Oct. 12, 2017.

(30) Foreign Application Priority Data

Mar. 30, 2018    (CN) .......................... 2018 1 0278322

(51) Int. Cl.
  *G09G 3/30*       (2006.01)
  *G09G 3/3225*     (2016.01)
  (Continued)

(52) U.S. Cl.
  CPC ............. *G09G 3/3225* (2013.01); *G09G 3/20* (2013.01); *H01L 27/156* (2013.01);
  (Continued)

(58) Field of Classification Search
  CPC .............................................. G09G 3/30–3291
  See application file for complete search history.

(56) References Cited

U.S. PATENT DOCUMENTS

| | | | | |
|---|---|---|---|---|
| 5,719,648 A | * | 2/1998 | Yoshii ................... | G02F 1/1309 349/42 |
| 6,424,092 B1 | * | 7/2002 | Odake ................. | H01L 27/3288 315/169.3 |

(Continued)

FOREIGN PATENT DOCUMENTS

| | | |
|---|---|---|
| CN | 101304059 A | 11/2008 |
| CN | 105204210 A | 12/2015 |

(Continued)

OTHER PUBLICATIONS

Chinese language office action dated Sep. 2, 2020, issued in application No. CN 201810278322.0.

*Primary Examiner* — Sanghyuk Park
(74) *Attorney, Agent, or Firm* — McClure, Qualey & Rodack, LLP

(57) ABSTRACT

A semiconductor device includes a first display unit and a second display unit. The first display unit includes a first substrate, first light-emitting units, and a first gate driver circuit. The first substrate includes a first display region. The first substrate has a first side and a second side. The first light-emitting units are disposed in the first display region. The first gate driver circuit is disposed in the first display region. The second display unit is adjacent to the first display unit. The second display unit includes a second substrate. The second substrate includes a second display region, second light-emitting units, and a second gate driver circuit. The second substrate has a third side and a fourth side. The second light-emitting units are disposed in the second display region. A second gate driver circuit is disposed in the second display region.

19 Claims, 10 Drawing Sheets

(51) Int. Cl.
*H01L 27/15* (2006.01)
*G09G 3/20* (2006.01)
*H01L 27/32* (2006.01)

(52) U.S. Cl.
CPC ... *H01L 27/3293* (2013.01); *G09G 2300/026* (2013.01); *G09G 2300/08* (2013.01); *H01L 27/3276* (2013.01)

(56) References Cited

U.S. PATENT DOCUMENTS

| | | |
|---|---|---|
| 7,897,983 B2 | 3/2011 | Kuo et al. |
| 10,019,950 B2 | 7/2018 | Tani et al. |
| 2011/0090320 A1* | 4/2011 | Tsuchida ............ G02B 27/2264 348/51 |
| 2014/0049522 A1* | 2/2014 | Mathew ............ H05B 33/0896 345/204 |
| 2015/0198831 A1* | 7/2015 | Kim .................... G02F 1/13336 345/1.3 |
| 2017/0148374 A1* | 5/2017 | Lee ...................... G09G 3/2092 |
| 2018/0040822 A1* | 2/2018 | Lin ........................ H01L 27/28 |

FOREIGN PATENT DOCUMENTS

| | | |
|---|---|---|
| CN | 106205439 A | 12/2016 |
| CN | 107039377 A | 8/2017 |

* cited by examiner ent Application No. 62/571,343 filed on Oct. 12, 2017 the
entirety of which is incorporated by reference herein. This
Application claims priority of China Patent Application No.
201810278322.0 filed on Mar. 30, 2018, the entirety of
which is incorporated by reference herein.

BACKGROUND

Field of the Disclosure

The present disclosure relates to a semiconductor device
and a driving method thereof, and in particular to a semiconductor device with display units and a driving method
thereof.

Description of the Related Art

In recent years, displays have been widely used for
dynamically displaying advertisements. Due to the size of
the displays, it is difficult to display a large area of advertisements using a single display.

In order to solve the above problems, in the prior art, a
large-area advertisement is displayed by joining many displays into one screen wall. However, each of the displays has
a wide frame, which may not display images on the display
surface. Therefore, a grid-like pattern appears on the image
displayed on the screen wall, which in turn affects the
quality of the image displayed on the screen wall.

Although existing displays have been generally adequate
for their intended purposes, they have not been entirely
satisfactory in all respects. Consequently, it would be desirable to provide a solution for improving displays.

BRIEF SUMMARY

The present disclosure provides a semiconductor device
comprises a first display unit and a second display unit. The
first display unit comprises a first substrate having a first
display region, wherein the first substrate has a first side and
a second side opposite to the first side; first light-emitting
units disposed in the first display region; and a first gate
driver circuit disposed in the first display region.

The second display unit is adjacent to the first display
unit. The second display unit comprises a second substrate
having a second display region, wherein the second substrate has a third side and a fourth side opposite to the third
side; second light-emitting units disposed in the second
display region; and a second gate driver circuit disposed in
the second display region.

The present disclosure provides a driving method of a
semiconductor device including providing a first display
unit, wherein the first display unit has a first side; a second
side opposite to the first side; a first display region located
between the first side and the second side; a plurality of first
drive transistors disposed in the first display region; a
plurality of first light-emitting units disposed in the first
display region; and a first circuit board disposed on the first
side.

The driving method of the semiconductor device further
comprises a second display unit, wherein the second display
unit comprises a third side adjacent to the second side; a
fourth side opposite to the third side; a second display region
located between the third side and the fourth side; a plurality
of second drive transistors disposed in the second display
region; a plurality of second light-emitting units disposed in
the second display region; and a second circuit board
disposed on the fourth side. The first drive transistors are
enabled from the second side to the first side in sequence,
and the second drive transistor are enabled from the fourth
side to the third side in sequence.

BRIEF DESCRIPTION OF THE DRAWINGS

The disclosure can be more fully understood by reading
the subsequent detailed description and examples with references made to the accompanying drawings, wherein.

DETAILED DESCRIPTION

Figure 1A:
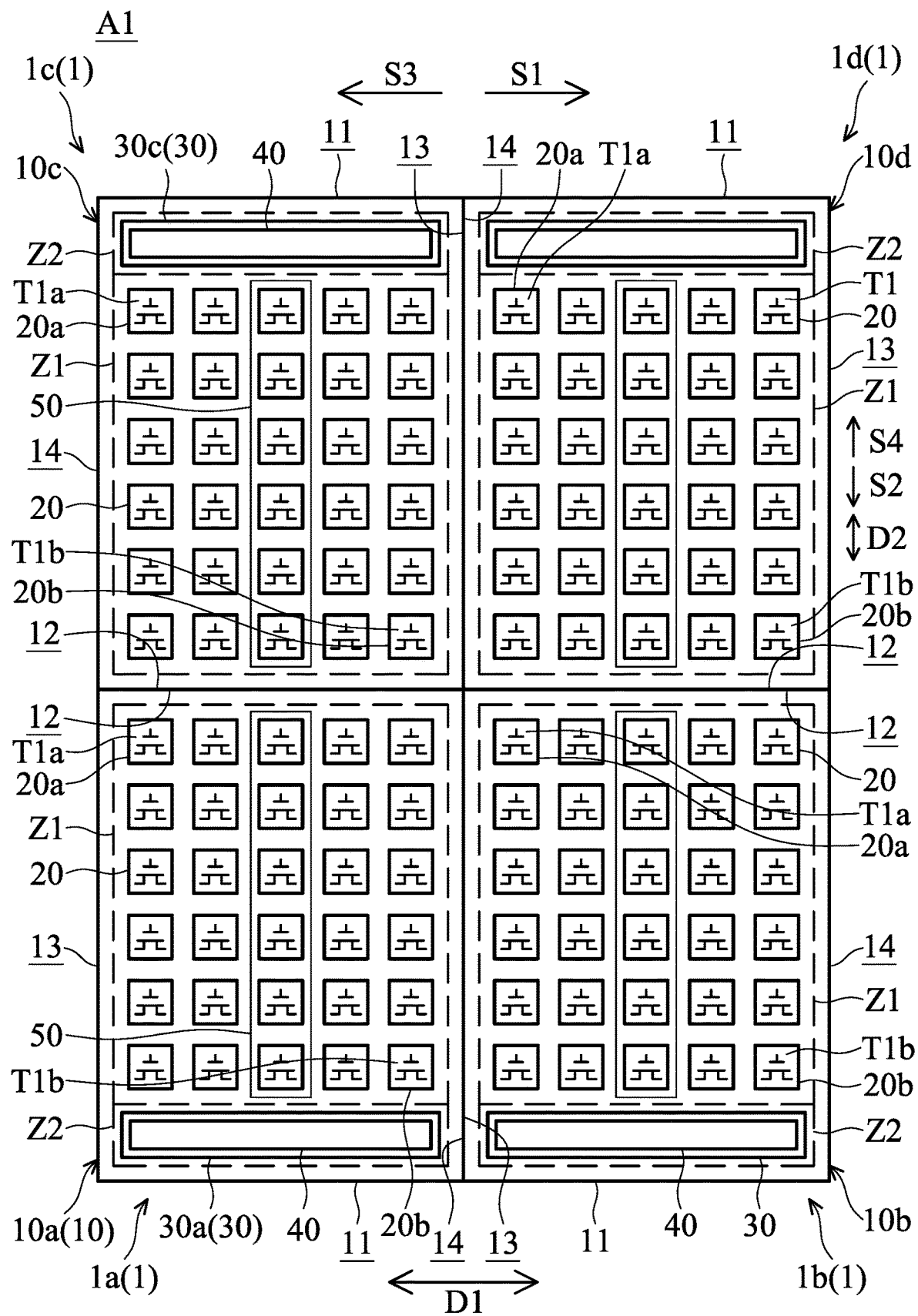
FIG. 1A is a schematic view of a semiconductor device in
accordance with some embodiments of the disclosure.

The following disclosure provides many different
embodiments, or examples, for implementing different features of the present disclosure. Specific examples of components and arrangements are described below to simplify
the present disclosure. For example, the formation of a first
feature over or on a second feature in the description that
follows may include embodiments in which the first and
second features are formed in direct contact, and may also
include embodiments in which additional features may be
formed between the first and second features, such that the
first and second features may not be in direct contact.

In addition, the present disclosure may repeat reference
numerals and/or letters in the various examples. This repetition is for the purpose of simplicity and clarity and does
not in itself dictate a relationship between the various
embodiments and/or configurations discussed.

Spatially relative terms, such as upper and lower, may be
used herein for ease of description to describe one element
or feature's relationship to other elements or features as
illustrated in the figures. The spatially relative terms are
intended to encompass different orientations of the device in
use or operation in addition to the orientation depicted in the
figures. The shape, size, thickness, and inclination depicted in the drawings may not be drawn to scale or may be simplified for clarity of discussion; these drawings are merely intended for illustration.

Figure 1B:
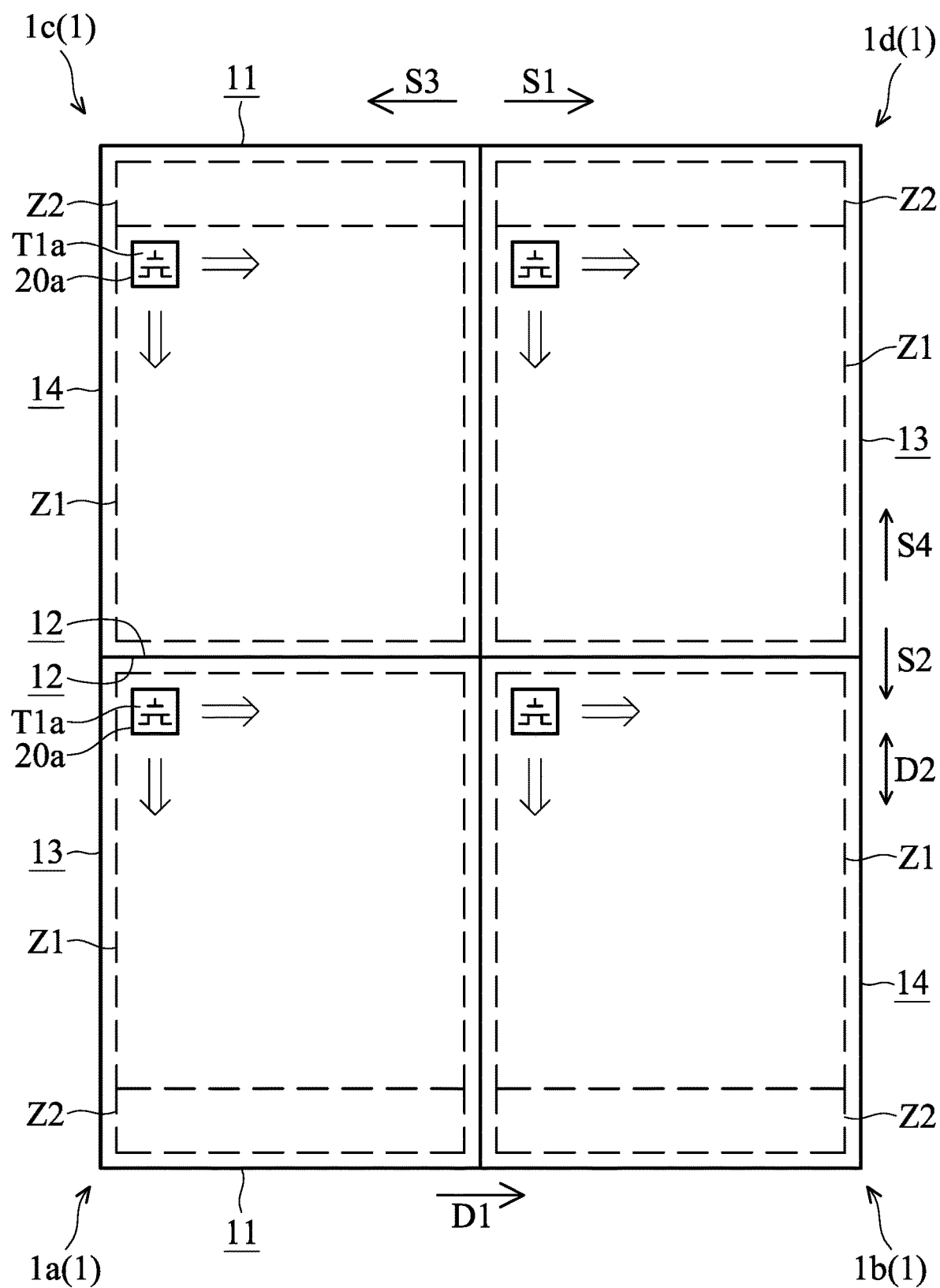
FIG. 1B is a simplified schematic view of the semiconductor device in accordance with some embodiments of the
disclosure.
Figure 1C:
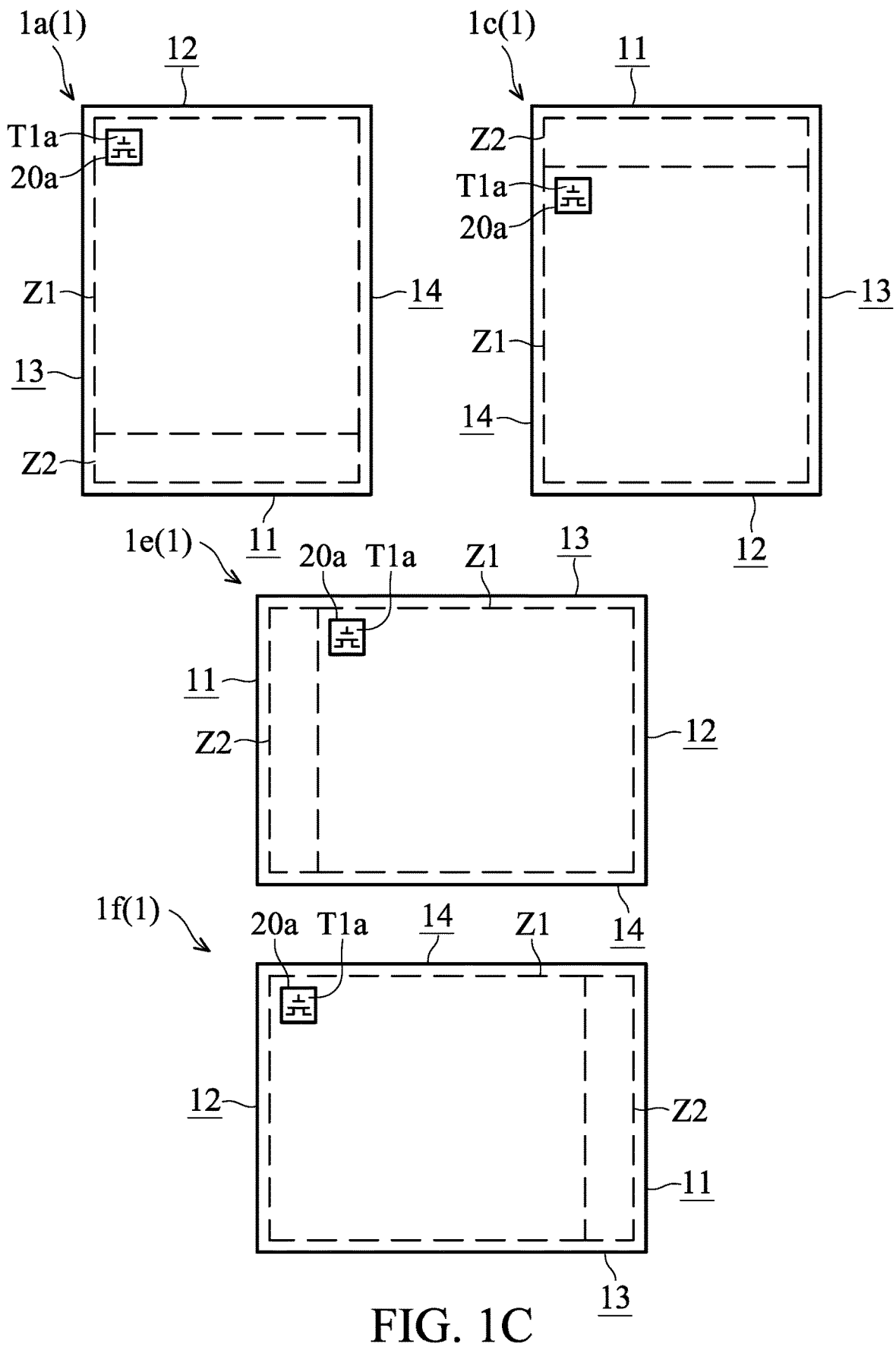
FIG. 1C is a simplified schematic view of the semiconductor device in accordance with some embodiments of the
disclosure.
Figure 2:
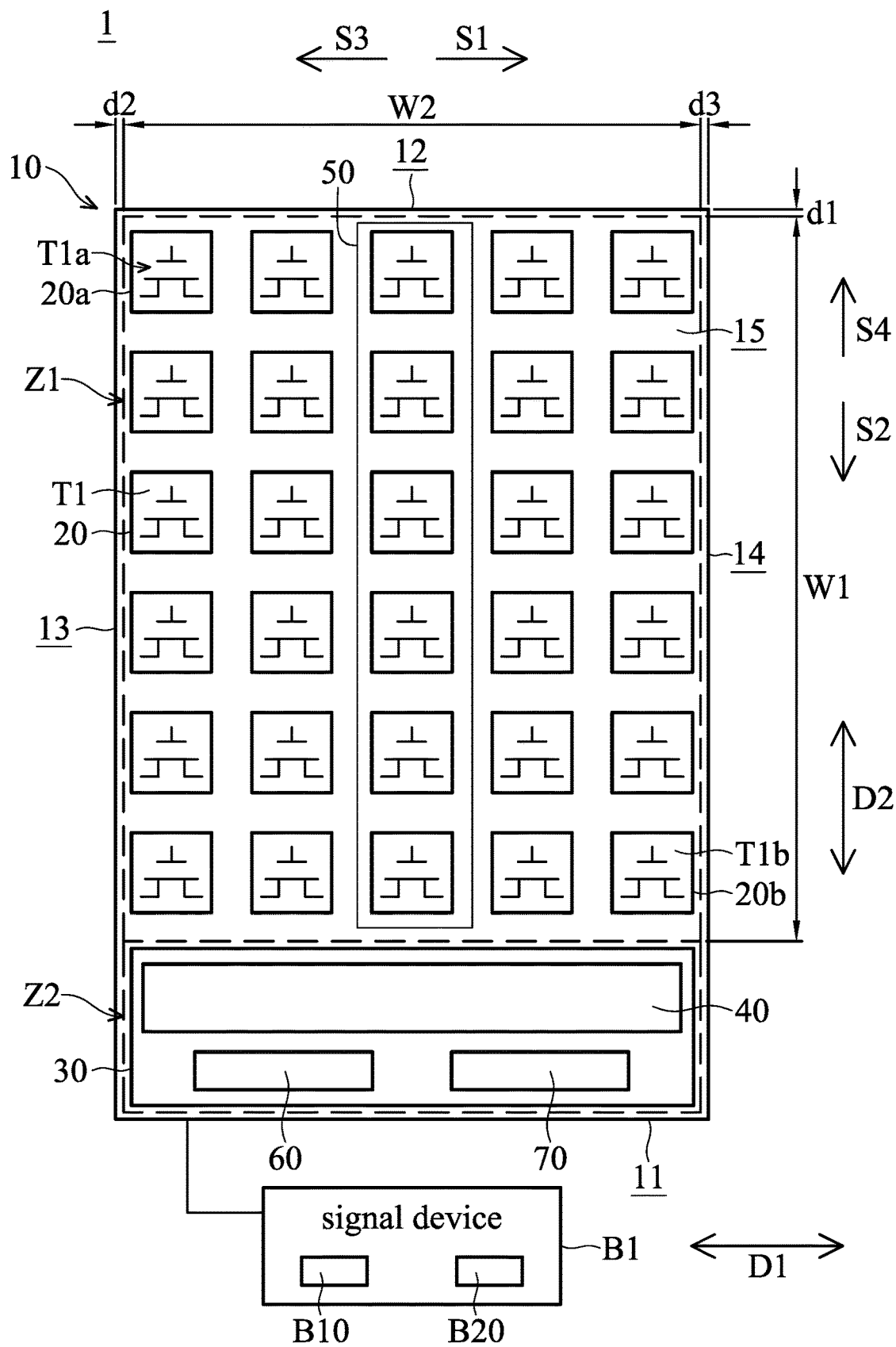
FIG. 2 is a schematic view of the display unit in accordance with some embodiments of the disclosure.

FIGS. 1A, 1B and 1C are schematic views of a semiconductor device A1 in accordance with some embodiments of the disclosure, wherein FIGS. 1B and 1C are simplifications of FIG. 1A. FIG. 2 is a schematic view of the display unit 1 in accordance with some embodiments of the disclosure. The semiconductor device A1 is configured to display a full image. In some embodiments, the semiconductor device A1 may be a display apparatus. The semiconductor device A1 comprises display units 1. The display units 1 may be arranged in an array, and each of the display units 1 displays a portion of the full image. In other words, each of the display unit 1 is configured to display a partial image. All of the partial images are joined to the full image. The full image and the partial images may be static images or motion images.

As shown in FIG. 1A, the display units 1 may be arranged in M×N, wherein the M and N are positive integer, and the M and N are greater than or equal to 1. In some embodiments, when the M equal to 1, the N is greater than or equal to 2. When the N equal to 1, the M is greater than or equal to 2. In some embodiments, the M is in a range from 1 to 30, and the N is in a range from 1 to 30. For example, the display units 1 are arranged in a 1×2, 1×3, 2×1, 2×2, 2×3, 3×1, 3×2, or 3×3 array, but they are not limited thereto. As shown in FIG. 1A, the display units 1 are arranged in a 2×2 array.

The display unit 1 may comprise organic light-emitting diodes (OLEDs), light-emitting diode (LED), micro LEDs, mini LEDs, liquid crystal pixels, quantum dots (QD), fluorescent materials, phosphor materials, or other display media, but they are not limited thereto. In some embodiments, the display unit 1 may be a flexible display, a touch display or a curved display, but it is not limited thereto.

Each of the display unit 1 comprises a substrate 10, light-emitting units 20, a circuit board 30, a data driver 40, and a gate driver circuit 50. In this embodiment, the sizes, structures and elements of the display units 1 may be the same, and thus the manufacturing cost of the semiconductor device A1 can be reduced. In some embodiments, the sizes, structures and elements of the display units 1 are different according to various designs.

The substrate 10 may be a rigid substrate, flexible substrate or combination thereof. The rigid substrate may comprise glass. In some embodiments, the sizes and/or shapes of the substrates 10 of the display unit 1 may be the same. In some embodiments, the substrate 10 may be a rectangle, a polygon, a circle, an ellipse, or an irregular shape, but it is not limited thereto. In some embodiments, the sizes and/or shapes of the substrates 10 of the display unit 1 may be different according to various designs, but they are not limited thereto.

In some embodiments, the substrates 10 have curved shapes. The semiconductor device A1 assembled by display units 1 may be a cylindrical or dome-shaped semiconductor device A1. The semiconductor device A1 assembled by the display units 1 may be a column or a dome. In some embodiments, the semiconductor device A1 assembled by display units 1 may have an irregular shape, but it is not limited thereto.

In this embodiment, the substrate 10 may be rectangle. The substrate 10 has a side 11, a side 12, a side 13, and a side 14. The side 11 and the side 12 may be extended in a first direction D1. In other words, the side 11 may be parallel to the side 12. The side 13 and the side 14 may be arranged in a second direction D2. In other words, the side 13 may be parallel to the side 14. The first direction D1 may be different than the second direction D2. In some embodiments, the first direction D1 is perpendicular to the second direction D2. Therefore, side 11 and side 12 may respectively be perpendicular to side 13 and side 14, but it is not limited thereto.

The substrate 10 comprises a display region Z1 and a control area Z2. The control area Z2 may be disposed on the side 11 of the substrate 10. In a top view, the area of the display region Z1 is 90%, 95%, or more, of the area of the substrate 10. The area of the control area Z2 is 10%, 5%, or less, of the area of the substrate 10.

The light-emitting units 20 may be arranged in an array in the display region Z1. In this embodiment, the area of the display region Z1 may be the area of the image displayed by the display unit 1. Therefore, the image is not presented on the area out of the display region Z1 on the main surface 15 of the substrate 10. In other words, the area out of the display region Z1 is the area of the frame of the display unit 1.

For clarity, there are thirty light-emitting units 20 illustrated in one display region Z1 in FIGS. 1A and 2. However, the number of light-emitting units 20 is not limited thereto. In some embodiments, there are two million, four million, or eight million light-emitting units 20, but it is not limited thereto.

The light-emitting unit 20 is configured to emit a color light beam. For example, the light-emitting unit 20 is configured to emit a red light beam, a yellow light beam, a green light beam, or a blue light beam. A pixel of an image is formed by various color light beams emitted by light-emitting units 20.

In this embodiment, the light-emitting units 20 are LEDs. In some embodiments, the light-emitting units 20 are micro LEDs, mini LEDs, OLEDs, QDs, fluorescent materials, or phosphor materials, but they are not limited thereto. In some embodiments, the sizes of the light-emitting diodes are in a range from about 300 μm to 10 mm. The sizes of the mini light-emitting diodes are in a range from about 100 μm to 300 μm, and the sizes of light-emitting diodes (micro LED) are in a range from about 1 μm to 100 μm, but they are not limited thereto.

In this embodiment, since the light-emitting units 20 are self-luminous and emit various colors, the display unit 1 may not comprise a backlight module. For example, the light-emitting units emit blue, red, green or white light beams. In some embodiments, the light-emitting units 20 may emit light beams with the same or different colors, but they are not limited thereto. In some embodiments, the display unit 1 may not comprise a liquid-crystal pixel structure and a light guide plate, and may not comprise a light source disposed on a side of the substrate 10. Therefore, the area of the frame of the display unit 1 is reduced, and the frame of the display unit 1 is narrowed (as shown in FIGS. 1A and 2).

In this embodiment, each of the light-emitting units 20 is electrically connected to at least one drive transistor T1. The drive transistors T1 are disposed on the display region Z1 of the substrate 10, and are electrically connected to the light-emitting units 20, the data driver 40 and the gate driver circuit 50. The drive transistor T1 may be a thin film transistor. As shown in FIG. 2, the circuit board 30 is connected to the substrate 10, and disposed in the control area Z2. The circuit board 30 is configured to electrically connect to a signal device B1. The signal device B1 is configured to transmit different video signals to the light-emitting units 20 via the circuit board 30. The data driver 40 may be disposed on the circuit board 30, and electrically connected to drive the transistor T1 and the circuit board 30.

The data driver 40 is configured to transmit data signals to the drive transistors T1 according to image signals.

The gate driver circuit 50 is disposed on the display region Z1, and electrically connected to drive the transistors T1 and the circuit board 30. The gate driver circuit 50 is configured to transmit gate signals to the drive transistors T1 according to the image signals. In this embodiment, the gate driver circuit 50 may be GIA (Gate driver in Array) drive circuit, wherein the gate IC function of the GIA drive circuit is integrated into the circuit in the display region Z1. In this embodiment, the gate driver circuit 50 extends along the second direction D2, and disposed in the center of the display region Z1. The position of the gate driver circuit 50 in this embodiment is just an example. In other embodiments, the position of the display region Z1 may be any position. In some embodiments, gate driver circuit 50 is disposed at a side of the display region Z1.

In this embodiment, gate signals generated by the gate driver circuit 50 enable or disable the drive transistor T1, and the brightness of the light-emitting unit 20 is controlled by data signals generated by the data driver 40. In detail, the light-emitting unit 20 emits a light beam corresponding to the brightness of the data signals when the driver transistor T1 is enabled. When the driver transistor T1 is disabled, the light-emitting unit 20 does not emit a light beam.

As shown in FIG. 2, since the gate driver circuit 50 may be disposed on the display region Z1, the gate driver circuit 50 may not be disposed on the region between the display region Z1 and the side 11, 12, 13, or 14. Therefore, the area of the display region Z1 on the substrate 10 is increased, and the area of the frame of the substrate 10 is reduced.

As shown in FIG. 2, according to the design of the semiconductor device A1, the display region Z1 extends to or is adjacent to the side 12, the side 13 and the side 14 of the substrate 10. In some embodiments, the display region Z1 has its longest length W1 in the second direction D2, and the shortest distance d1 between the display region Z1 and the side 12 is less than the 1% of the longest length W1. In some embodiments, the shortest distance d1 between the display region Z1 and the side 12 is less than or equal to 5 mm. In some embodiments, the shortest distance d1 between the display region Z1 and the side 12 is about 0 mm. The distance d1 and the length W1 are measured in the second direction D2.

Moreover, the display region Z1 has its longest length W2 in the first direction D1, and the shortest distance d2 between the display region Z1 and the side 13 is less than 1% of the longest length W2. In some embodiments, the shortest distance d2 between the display region Z1 and the side 13 is less than or equal to 5 mm. In some embodiments, the shortest distance d2 between the display region Z1 and the side 13 is about 0 mm. the display region Z1 has its longest length W2 in the first direction D1, and the shortest distance d3 between the display region Z1 and the side 14 is less than 1% of the longest length W2.

In some embodiments, the shortest distance d3 between the display region Z1 and the side 14 is less than or equal to 5 mm. In some embodiments, in the first direction D1, the shortest distance d3 between the display region Z1 and the side 14 is about 0 mm. The distances d2 and d3 and the longest length W2 are measured in the first direction D1. The distances d2 and d3 may be equal to the width of the frame of the display unit 1.

When the distances d1, d2 or d3 between the display regions Z1 of different display units 1 are less than 5 mm, the full image displayed by the semiconductor device A1 may not appear grid lines to the user watching the full image.

As shown in FIG. 1A and 2, in this embodiment, when display units 1 are connected in different directions, display units 1 may be joined at the side 12, the side 13, and/or the side 14 of the substrate 10.

When the display units 1 are joined in a different direction, the display units 1 are joined at the sides 12, the sides 13, and/or the sides 14 of the substrates 10. Therefore, different partial images displayed by display units 1 can be joined by a narrow pitch, or the distances between the partial images can be minimized.

In this embodiment, the distance between the partial images is less than or equal to 10 mm. In some embodiments, the distance between the partial images is about 0 mm. Therefore, the full image displayed by the semiconductor device A1 may not appear grid lines, or the widths of the grid lines may be minimized, and thus the quality of the full image can be improved.

In some embodiments, the distance between the side 12 of the substrate 10a and the side 12 of the substrate 10c is less than the distance between the side 11 of the substrate 10a and the side 11 of the substrate 10c. In this embodiment, since the circuit board 30 is adjacent to and disposed on the side 11, the side 11 of the substrate 10 may not be connected to another substrate 10. As shown in FIG. 1A, the circuit board 30a of the substrate 10a is adjacent to the side 11. Therefore, the sides 11 of the substrate 10a and the substrate 10b may not be connected to another substrate. The circuit board 30c of the substrate 10c is adjacent to the side 11. Therefore, the sides 11 of the substrate 10c and the substrate 10d may not be connected to another substrate.

Accordingly, according to the design and arrangement of the display units 1, the gaps between the substrates 10 (for example, the substrates 10a to 10d) are short, and the gaps between the display regions Z1 of the substrates 10 (for example, the substrates 10a to 10d) are short. Therefore, the quality of the full image of the semiconductor device A1 is improved.

FIG. 1C is a schematic view of display units 1 arranged in different orientations. As shown in FIG. 1C, the position of the control areas Z2 and the initial drive transistors T1a in the display units 1a, 1c, 1e and if can be different, and the better visual effect and space utilization can be achieved after the display units are joined to the semiconductor device A1.

As shown in FIG. 1B, the display units 1 with various orientations can be joined to the semiconductor device A1. In other words, the positions of the initial drive transistors T1a in some display units (1a~1d) may be the same or different, but they are not limited thereto.

When the display unit 1a and the display unit 1b shows partial images, the driver transistors T1 arranged in the first direction D1 sequentially enable the corresponding light-emitting units 20 from the side 13 to the side 14. The drive transistors T1 arranged in the second direction D2 sequentially enable the corresponding light-emitting units 20 from the side 12 to the side 11. When the display unit 1c and the display unit 1d show partial images, the driver transistors T1 arranged in the first direction D1 sequentially enable the corresponding light-emitting units 20 from the side 14 to the side 13, and the driver transistors T1 arranged in the second direction D2 sequentially enables the corresponding light-emitting units 20 from the side 11 to the side 12. In other words, the driver transistors T1 of the display units 1 in the semiconductor device A1 enable the corresponding light-emitting units 20 in the enable direction S1 or the enable direction S2.

In some embodiments, the driver transistors T1 of the display units 1 in the semiconductor device A1 can enable the corresponding light-emitting units 20 according to the enable direction S3, and enable the corresponding light-emitting units 20 according to the enable direction S4. The enable direction S3 is opposite to the enable direction S1, and the enable direction S4 is opposite to the enable direction S2.

As shown in FIG. 2, when the display unit 1 displays a partial image, the signal device B1 transmits image signals. The data driver 40 and the gate driver circuit 50 control the drive transistors T1 to enable the corresponding light-emitting units 20 in sequence according to image signals. In one partial image, the gate driver circuit 50 enables the initial drive transistor T1a, and the data driver 40 enables the initial light-emitting unit 20a corresponding to the initial drive transistor T1a. Finally, the gate driver circuit 50 enables the terminal drive transistor T1b, and the data driver 40 enables the terminal light-emitting unit 20b corresponding to the terminal drive transistor T1b.

The initial drive transistor T1a and the terminal drive transistor T1b may be disposed at two opposite corners of the display region Z 1. For example, in FIG. 2, the initial drive transistor T1a is disposed in the corner between the side 12 and the side 13. The terminal drive transistor T1b is disposed in the corner between the side 11 and the side 14.

Moreover, the initial light-emitting unit 20a and the terminal light-emitting unit 20b are disposed at opposite corners of the display region Z1. As shown in FIG. 2, the initial light-emitting unit 20a is disposed in a corner between the side 12 and the side 13. The terminal light-emitting unit 20b is disposed in the corner between the side 11 and the side 14.

For example, the gate driver circuit 50 controls the first row of the drive transistors T1 in FIG. 2 to be enabled from the initial drive transistor T1a in sequence and in the enable direction S1. Afterward, the gate driver circuit 50 controls the second row of the drive transistors T1 to be enabled in the enable direction S1. Until the gate driver circuit 50 controls the driver transistors T1 of the last row, in which the terminal drive transistor T1b is disposed, to be enabled in the enable direction S1. Moreover, the data driver 40 controls the light-emitting units 20 to be enabled from the initial light-emitting unit 20a in sequence and in the enable direction S2.

As shown in FIG. 2, in some embodiments, the display unit 1 further comprises a first display-switching controller 60 and a second display-switching controller 70. The first display-switching controller 60 and the second display-switching controller 70 control the direction of enabling the drive transistors T1 and the position of the initial drive transistor T1a, and control the direction of enabling the light-emitting units 20 and the position of the initial light-emitting unit 20a.

As shown in FIG. 2, the first display-switching controller 60 controls the drive transistors T1 to enable the corresponding to the light-emitting units 20 in sequence in the enable direction S1 or in the enable direction S3. The second display-switching controller 70 controls the drive transistors T1 to enable the corresponding light-emitting unit 20 in sequence in the enable direction S2 or in the enable direction S4. In some embodiments, the enable directions S1 to S4 is chosen according to the position of the initial drive transistor T1a and the terminal drive transistor T1b, but it is not limited thereto.

In some embodiments, the first display-switching controller 60 and the second display-switching controller 70 may be controlled by a mechanical switch, so as to change the direction of enabling the light-emitting units 20.

As shown in FIG. 2, in some embodiments, the display unit 1 further comprises a first display-switching module B10 and a second display-switching module B20. The first display-switching module B10 and the second display-switching module B20 control the first display-switching controller 60 and the second display-switching controller 70. In some embodiments, the first display-switching module B10 and the second display-switching module B20 may be an external system, and transmit signals to the first display-switching controller 60 and the second display-switching controller 70 so as to switch different directions of the outputting image, and changing the enable directions of the light-emitting units 20. In this embodiments, for example, the different directions mean horizontal and vertical direction , but they are not limited thereto.

In some embodiments, the signals of the first display-switching controller 60 and the second display-switching controller 70 can be controlled by different transmission protocol interfaces so as to change the direction of enabling the light-emitting units 20. For example, the first display-switching module B10 and the second display-switching module B20 are computer program. The user can operate the signal device B1 to generate a switching signal to control the first display-switching module B10 and the second display-switching module B20 so as to change the directions of enabling the drive transistors T1 and the light-emitting units 20.

Figure 3:
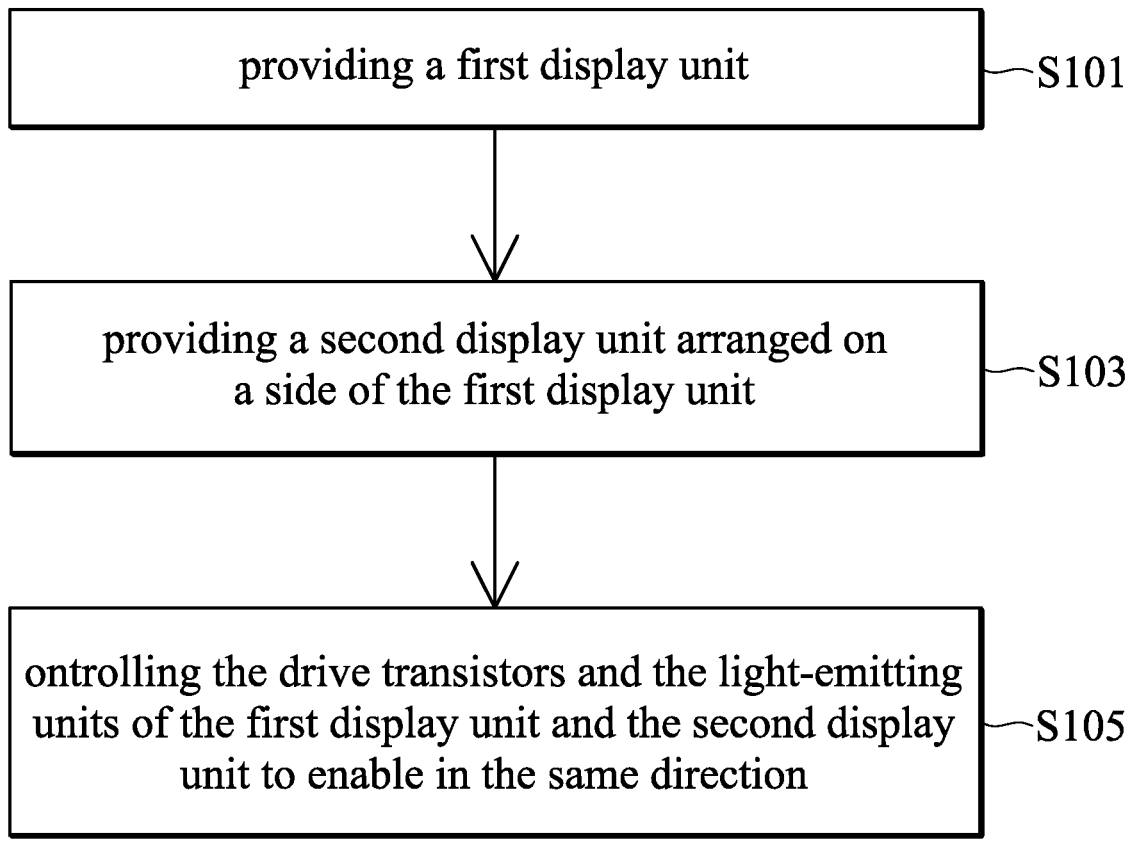
FIG. 3 is a driving method of the semiconductor device in
accordance with some embodiments of the disclosure.

FIG. 3 is a driving method of the semiconductor device A1 in accordance with some embodiments of the disclosure. In step S101, a first display unit 1a is provided. The first display unit 1a comprises a first side 11 and a second side 12 opposite to the first side 11. A first display region Z1 is located between the first side 11 and the second side 12. A plurality of first drive transistors T1 are disposed in the first display region. A plurality of first light-emitting units 20 are disposed in the first display region Z1. A first circuit board 30 is disposed on the first side 11.

In step S103, a second display unit 1c is provided. The second display unit 1c comprises a third side 12 adjacent to the second side 12 of the first display unit 1a, and a fourth side 11 opposite to the third side 12 of the first display unit 1a. The second display unit 1c comprises a second display region Z1 located between the third side 12 and fourth side 11. A plurality of second drive transistors T1 are disposed in the second display region. A plurality of second light-emitting units 20 are disposed in the second display region Z1 of the second display unit 1c. A second circuit board 30 is disposed on the fourth side 11. The first drive transistors T1 of the first display unit 1a are enabled from the second side 12 to the first side 11 in sequence, and the second drive transistors T1 of the second display unit 1c are enabled from the fourth side 11 to the third side 12 in sequence.

Moreover, the second display unit 1c is disposed adjacent to the first display unit 1a in the second direction D2. As shown in FIG. 1A, the third side 12 of the substrate 10c of the second display unit 1c is connected to the second side 12 of the substrate 10a of the first display unit 1a.

In step S101 and S103, as shown in FIG. 1B, the drive transistors T1 of the display unit 1 enable the corresponding light-emitting units 20 in the same direction.

In some embodiments, the drive transistors T1 of the display unit 1a enable the corresponding light-emitting units 20 from the side 12 to the side 11 in sequence and enable the corresponding light-emitting units 20 from the side 13 to the side 14 in sequence. The drive transistors T1 of the second display unit 1c enable the corresponding light-emitting units 20 from the side 11 to the side 12, and enable the corresponding light-emitting units 20 from the side 14 to the side 13.

The driving method of the semiconductor device A1 can easily display a full image by tiling a plurality of display unit 1.

Figure 4:
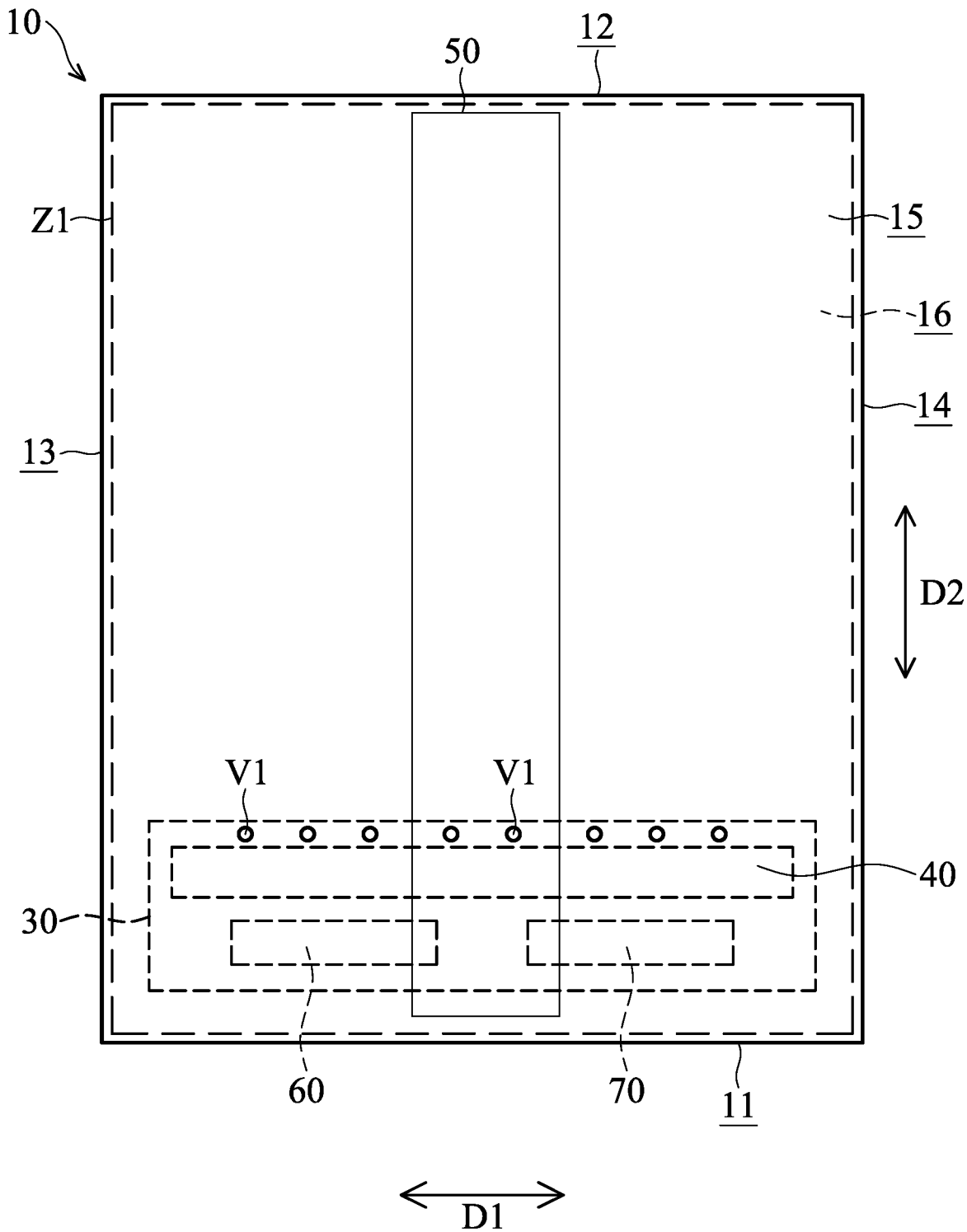
FIG. 4 is a schematic view of the display unit in accordance with some embodiments of the disclosure.

FIG. 4 is a schematic view of the display unit 1g in accordance with some embodiments of the disclosure. For clarity, the light-emitting units 20 and the drive transistors T1 are not illustrated in FIG. 4. The display region Z1 of the substrate 10 is adjacent to the side 11 of the substrate 10. The circuit board 30 is not disposed on the main surface 15, which the light-emitting unit 20 disposed on, of the substrate 10. The circuit board 30 is disposed on the rear surface 16 opposite to the main surface 15. The data driver 40, the first display-switching controller 60, and the second display-switching controller 70 are disposed on the circuit board 30, which is disposed on the rear surface 16, and are electrically connected to the drive transistors T1 via conductive materials in the through hole V1, which is formed on the substrate 10. Therefore, the driving method can reduce the area occupied by components such as the data driver 40 on the display unit 1g. The frame can be narrowed by the components, such as the data driver 40, disposed on the rear surface 16 of the substrate 10. In some embodiments, the through holes V1 can be formed on a flexible board, a rigid board or combination thereof The substrate 10 comprises through holes V1 connected to the main surface 15 and the rear surface 16. For example, through holes V1 can be formed on the substrate 10 by through glass via (TGV). Moreover, conductive materials can be filled in the through holes V1. The circuit board 30 on the rear surface 16 is electrically connected to the light-emitting units 20 (as shown in FIG. 2), the drive transistors T1 (as shown in FIG. 2), or the gate driver circuit 50 on the main surface 15 via the through holes V1.

In some embodiments, the through holes V1 can be formed by laser drilling or wet etching. The through holes V1 may be filled in by the conductive materials using electroplating or ink jet. In some embodiments, the conductive materials may fill the through holes V1 using screen printing.

In some embodiments, when the display unit 1g is LTPS (Low Temperature Poly-silicon) display unit, the drive transistors T1 are be formed first, and then the protective layer is formed (not shown in figures). Afterward, the through holes V1 are formed on the substrate 10 and the protective layer. Finally, the light-emitting diodes can be disposed on the substrate 10 LED post process). In some embodiments, if the display unit 1g may comprise other materials (such as oxide semiconductor materials, polycrystalline silicon materials, or other suitable semiconductor materials), the drive transistors T1 may optionally be formed by suitable structures, but it is not limited thereto.

The data driver 40, the first display-switching controller 60, or the second display-switching controller 70 is disposed on the rear surface 16 of the substrate 10, and thus the display region Z1 of the substrate 10 display region Z1 can be further increased, and the area of the frame of the display unit 1g is reduced. Moreover, another substrate of a display unit can be connected to the side 11.

Figure 5:
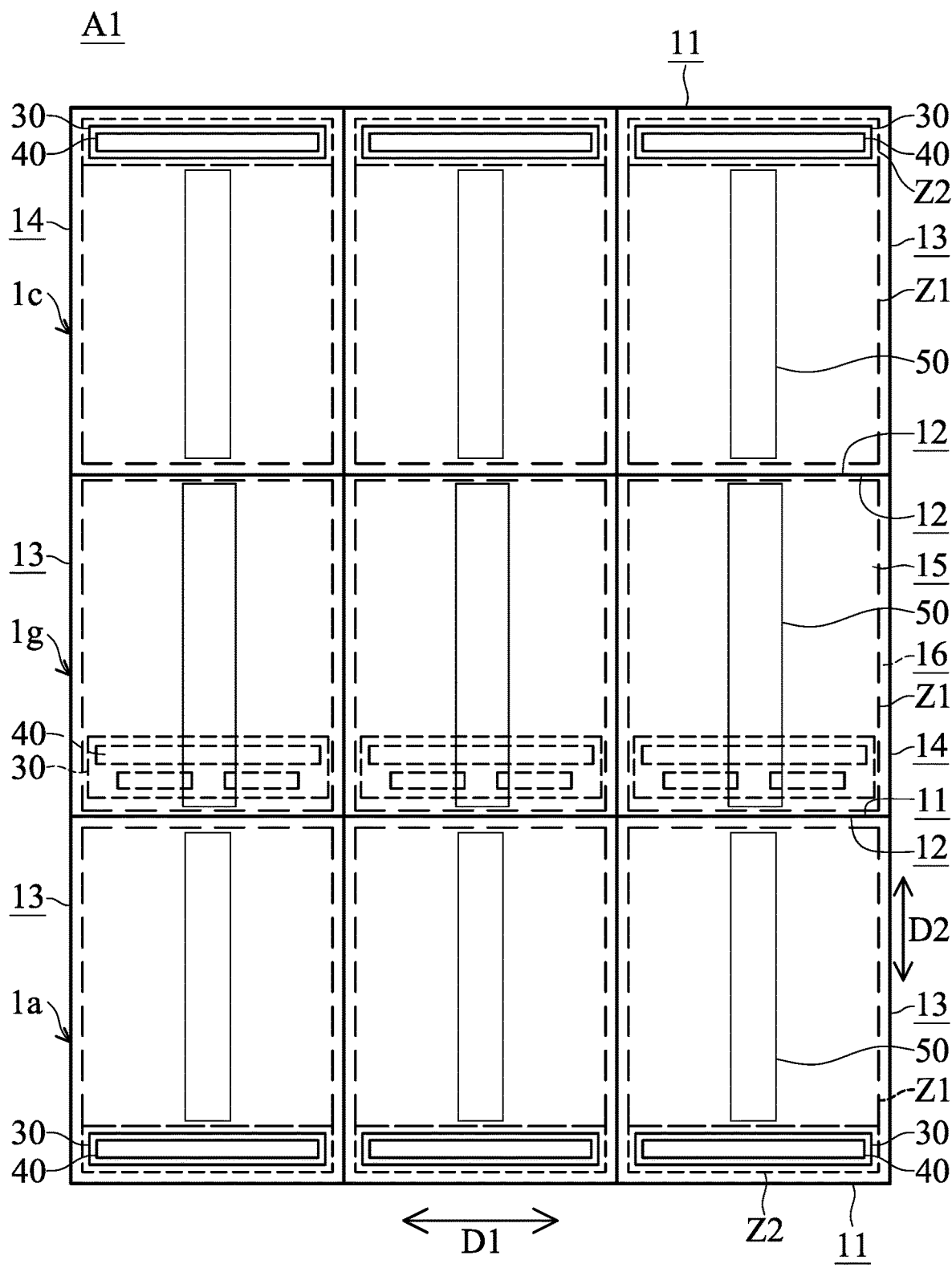
FIG. 5 is a schematic view of the semiconductor device in
accordance with some embodiments of the disclosure.

FIG. 5 is a schematic view of the semiconductor device A1 in accordance with some embodiments of the disclosure. As shown in FIG. 5, the display units 1a, the display units 1g and the display units 1c may be arranged in the second direction D2, and the display units 1g are located between the display units 1a and the display units 1c. The display units 1a may be arranged in the first direction D1. The display units 1g may be arranged in the first direction D1. The display units 1c may be arranged in the first direction D1. Since the circuit board 30 of the display units 1g are disposed on the rear surface 16, the sides 11 of the display units 1g may be connected to the sides 12 of the display units 1a, and the sides 12 of the display units 1g may be connected to the sides 12 of the display units 1c.

Moreover, the display regions Z1 of the display units 1a may be connected to or adjacent to the display regions Z1 of the display units 1g, and the display regions Z1 of the display units 1c may be connected to or adjacent to the display regions Z1 of the display units 1g. Therefore, the full image displayed by the semiconductor device A1 may not appear grid lines, or the widths of the grid lines may be minimized, and thus the quality of the full image can be improved.

In some embodiments, the whole of the semiconductor device A1 in FIG. 5 may be form by the display units 1g.

Figure 6:
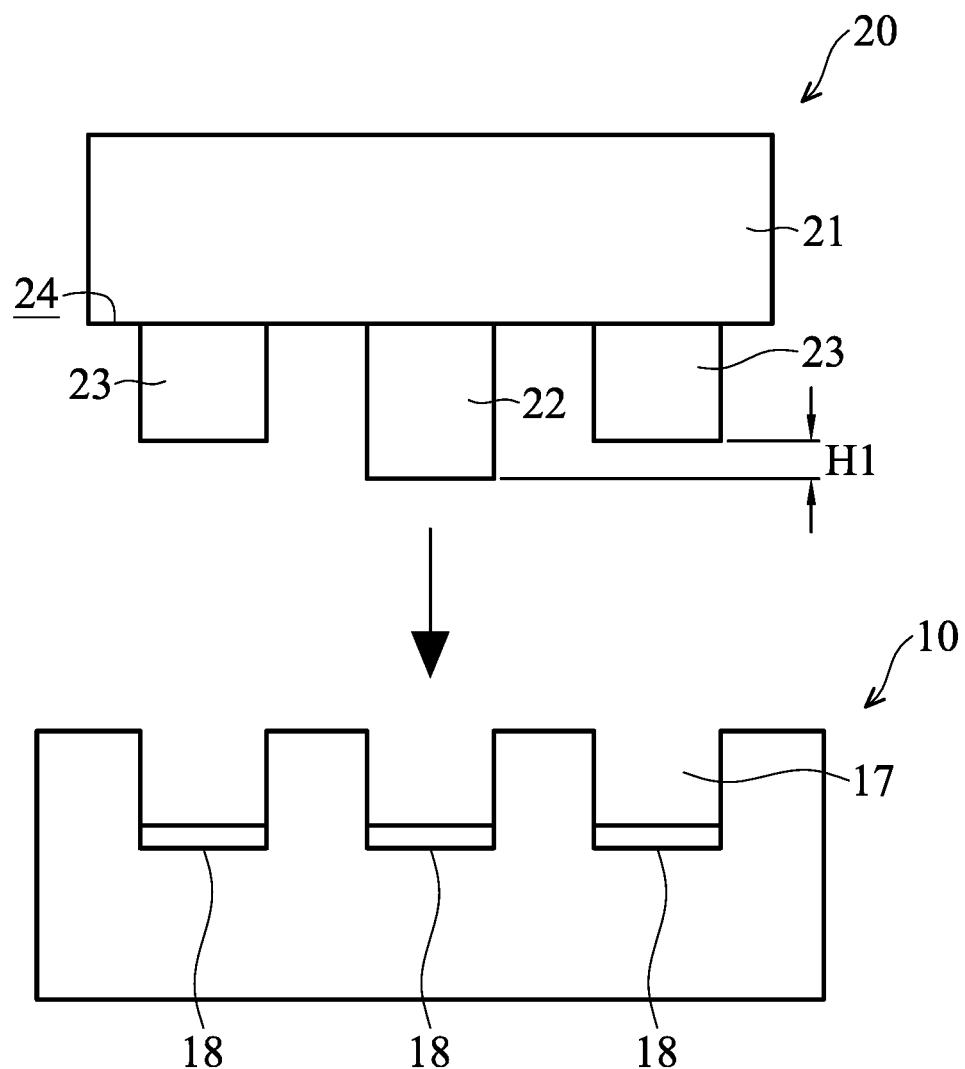
FIG. 6 is a schematic view of the light-emitting units and
the substrate in accordance with some embodiments of the
disclosure.

FIG. 6 is a schematic view of the light-emitting units 20 and the substrate 10 in accordance with some embodiments of the disclosure. Each of the light-emitting units 20 comprises a light-emitting body 21, a first electrode 22 and a second electrode 23. The first electrode 22 and the second electrode 23 may be disposed on the lower surface 24 of the light-emitting body 21. In some embodiments, the first electrode 22 is disposed on the center of the lower surface 24, and the second electrode 23 is surrounding the first electrode 22. The first electrode 22 may be a columnar structure, and the second electrode 23 may be a ring-like structure. The first electrode 22 may be a P electrode, and the second electrode 23 may be an N electrode. In some embodiments, the first electrode 22 may be an N electrode, and the second electrode 23 may be a P electrode.

In this embodiment, the height of the first electrode 22 relative to the lower surface 24 is greater than or equal to the height of the second electrode 23 relative to the lower surface 24. In some embodiments, the height difference H1 is between the first electrode 22 and the second electrode 23 and relative to the lower surface 24. The height difference H1 is greater than or equal to 0 μm, and less than or equal to 0.5 μm (0 ≤H1≤0.5 μm).

The substrate 10 has grooves 17, and a conductive pad 18 is disposed on the bottom of the groove 17. When the light-emitting unit 20 is connected to the substrate 10, the first electrode 22 and the second electrode 23 are disposed in the groove 17, and in contact with the conductive pad 18. In this embodiment, the height of the first electrode 22 relative to the lower surface 24 is greater than or equal to the height of the second electrode 23 relative to the lower surface 24. Therefore, it can be ensured that the first electrode 22 is in contact with the conductive pad 18. If the height of the first electrode 22 relative to the lower surface 24 is equal to the height of the second electrode 23 relative to the lower surface 24, the second electrode 23 can be in contact with the conductive pad 18. Moreover, if the height of the first electrode 22 relative to the lower surface 24 is greater than the height of the second electrode 23 relative to the lower surface 24, the light-emitting unit 20 may be tilted with respect to the substrate 10 by pressing the light-emitting unit 20 to the substrate 10 so that the second electrode 23 can be in contact with the conductive pad 18. In some embodiments, the width of the groove 17 is greater than the width of the first electrode 22 or the second electrode 23.

Accordingly, according to the design of the light-emitting unit 20, the chance of the first electrode 22 and the second electrode 23 being in contact with the conductive pad 18 is increased, and thus the yield of the display unit 1 can be improved.

Figure 7:
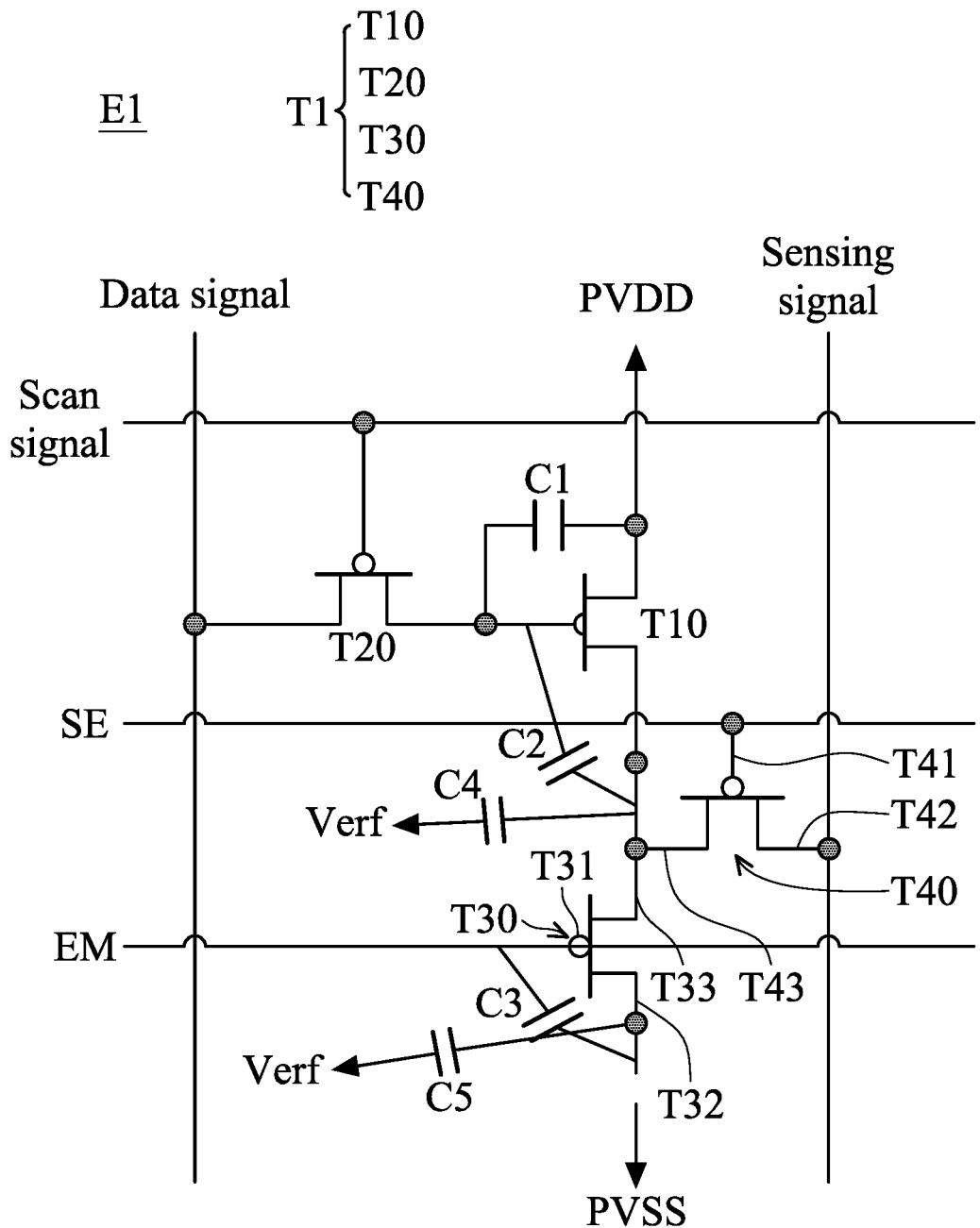
FIG. 7 is a schematic view of a control circuit in accordance with some embodiments of the disclosure.
Figure 8:
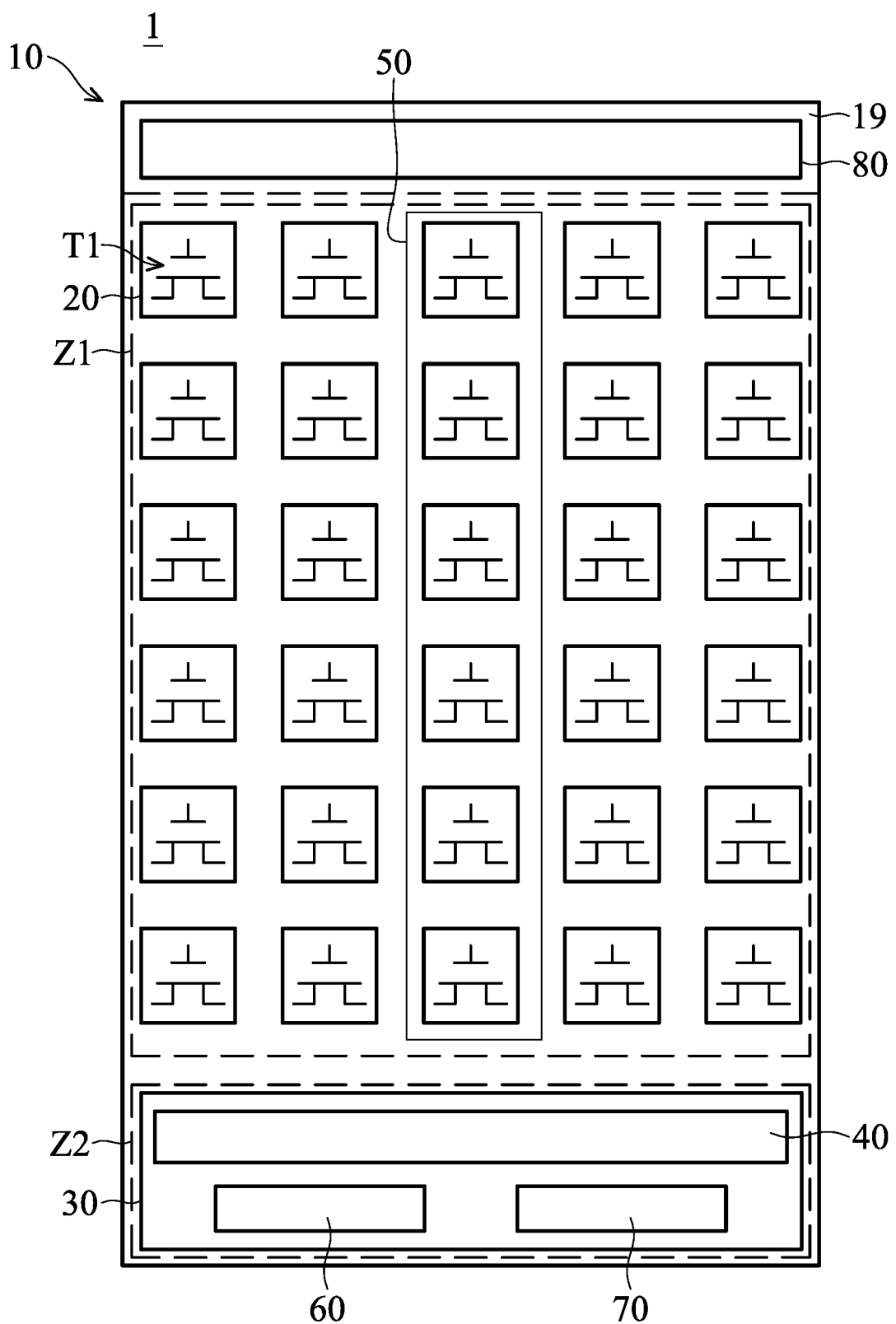
FIG. 8 is a schematic view of the display unit in accordance with some embodiments of the disclosure.

For the purpose of achieving a narrow frame, a test circuit can be designed according to the embodiments of FIGS. 7 and 8. In the embodiment of FIG. 7, the test circuit is integrated in the display region Z 1. FIG. 7 is a schematic view in accordance with some embodiments of the disclosure. For clarity, one control circuit E1, which corresponds to one light-emitting unit 20, is illustrated, and a test circuit is integrated in the control circuit E1. In some embodiments, one control circuit E1 may correspond to light-emitting units 20, which are coupled with the control circuit E1.

The control circuit E1 is coupled with at least one light-emitting unit 20, data driver 40, and gate driver circuit 50 (as shown in FIG. 2). The control circuit E1 is configured to receive the gate signals generated by the gate driver circuit 50, and receive the data signals generated by the data driver 40. The control circuit E1 controls the drive transistor T1 to enable or disable the light-emitting unit 20 according to the gate signals, and controls the light-emitting unit 20 to emit light beams of different brightness according to the data signals.

In this embodiment, in order to measure whether all drive transistors T1 (T10, T20, T30 and T40) can operate normally in the display region Z1, the test capacitances C4 and C5 are added to the control circuit E1.

The maximum capacitance value of the test capacitances C4 and C5 may be greater than 35 μF, for example. In this embodiment, the control circuit E1 comprises both test capacitance C4 and test capacitance C5. In some embodiments, the control circuit E1 may not comprise test capacitance C4. In some embodiments, the control circuit E1 may not comprise test capacitance C5.

The test capacitance C4 is coupled with the drive transistors T10 and T40, and thus it can be determined whether the driver transistors T10 and T40 can work normally by measuring the voltage of test capacitance C4.

In some embodiments, the drive transistor T40 comprises a gate end T41, a second end T42, and a third end T43. The gate end T41 of the drive transistor T40 is configured to receive the signals of the sensing driver (SE). The second end T42 is coupled with the light-emitting unit 20 (as shown in FIG. 2), and the test capacitance C4 is coupled with the third end T43.

The test capacitance C5 is coupled with the drive transistor T30, and thus it can be determined whether the drive transistor T30 can work normally by measuring the voltage of capacitance C5.

In some embodiments, the drive transistor T30 comprises a gate end T31, a second end T32, and a third end T33. The gate end T31 of the drive transistor T30 is configured to receive the signals of the emission driver (EM). The second end T32 is coupled with the test capacitance C5, and the third end T33 is coupled with the drive transistor T40.

Accordingly, by the capacitance C1, the test capacitance C4 and the test capacitance C5, the drive transistors T1 (T10, T20, T30 and T40) of the control circuit E1 can be measured in the display region Z1, which in turn can increase the yield of the display unit 1.

Since the drive transistors T1 (T10, T20, T30 and T40) of the control circuit E1 can be measured in the display region Z1, the yield of the display unit 1 can be improved. Moreover, the display unit 1 may not comprise a test circuit out of the display region Z1 for testing the drive transistor T1 on the substrate 10, and thus the area of the display region Z1 can be increased, and the area of the frame of the substrate 10 is reduced.

FIG. 8 is a schematic view of the display unit 1 in accordance with some embodiments of the disclosure. The substrate 10 further comprises a cutting portion 19 connected to the display region Z1. The display unit 1 further comprises a test circuit 80 disposed on the cutting portion 19. The test circuit 80 on the cutting portion 19 is electrically connected to the light-emitting units 20 and the drive transistors T1. In this embodiment, when the drive transistors T1 and the light-emitting units 20 are enabled, the test circuit 80 can be used to check whether the driver transistors T1 and the light-emitting units 20 are operated normally.

When the inspection step is performed for the light-emitting units 20 or the drive transistors T1, the cutting portion 19 of the substrate 10 may be cut off. Therefore, the area of the display region Z1 is increased, and the area of the frame of the substrate 20 is reduced.

In conclusion, the frame of the display unit is minimized. When display units are joined to a semiconductor device, the full image displayed by the semiconductor device has grid lines with a minimized area, and thus the quality of the full image can be improved.

It should be understood that additional operations can be provided before, during, and after the method, and some of the operations described can be replaced or eliminated for other embodiments of the method.

While the disclosure has been described by way of example and in terms of embodiment, it should be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
a first display unit comprising:
a first substrate comprising a first active display area for displaying images, wherein the first substrate has a first side and a second side opposite to the first side;
a plurality of first light-emitting units disposed in the first active display area; and
a first gate driver circuit disposed in the first active display area; and
a second display unit adjacent to the first display unit, wherein the second display unit comprises:
a second substrate comprising a second active display area for displaying images, wherein the second substrate has a third side and a fourth side opposite to the third side;
a plurality of second light-emitting units disposed in the second active display area; and
a second gate driver circuit disposed in the second active display area.

2. The display device as claimed in claim 1, wherein the first display unit further comprises a first circuit board adjacent to the first side, the second display unit further comprises a second circuit board adjacent to the fourth side, and a distance between the second side and the third side is less than a distance between the first side and the fourth side.

3. The display device as claimed in claim 2, wherein the first display unit further comprises a first data driver electrically connected to the first light-emitting units, the first substrate further comprises a first control area adjacent to the first side, and the first data driver and the first circuit board are disposed in the first control area.

4. The display device as claimed in claim 3, wherein the second display unit further comprises a second data driver electrically connected to the second light-emitting units, the second substrate further comprises a second control area adjacent to the fourth side, and the second data driver and the second circuit board are disposed in the second control area.

5. The display device as claimed in claim 2, wherein when the first display unit displays an image, the first light-emitting units are enabled from the second side to the first side, and the second light-emitting units are enabled from the fourth side to the third side.

6. The display device as claimed in claim 2, wherein the first substrate further comprises a first through hole, the second substrate further comprises a second through hole, and the first gate driver circuit is electrically connected to the first circuit board via the first through hole, and the second gate driver circuit is electrically connected to the second circuit board via the second through hole.

7. The display device as claimed in claim 6, wherein the first gate driver circuit is disposed on a first main surface of the first substrate, and the first circuit board is disposed on a first rear surface opposite to the first main surface.

8. The display device as claimed in claim 7, wherein the second gate driver circuit is disposed on a second main surface of the second substrate, and the second circuit board is disposed on a second rear surface opposite to the second main surface.

9. The display device as claimed in claim 1, wherein a shortest distance between the first active display area and the second side is less than or equal to 5 mm, and a shortest distance between the second active display area and the third side is less than or equal to 5 mm.

10. The display device as claimed in claim 1, wherein one of the first light-emitting units comprises a first electrode and a second electrode surrounding the first electrode, and a height of the first electrode is greater than or equal to a height of the second electrode.

11. The display device as claimed in claim 10, wherein a height difference between the first electrode and the second electrode is greater than or equal to 0 μm, and less than or equal to 0.5 μm.

12. The display device as claimed in claim 1, wherein the first substrate further comprises a first drive transistor and a first capacitance, and the first drive transistor comprises a gate end, a second end, and a third end, wherein the second end of the first drive transistor is electrically connected to one of the first light-emitting units, and the first capacitance is electrically connected to the third end.

13. The display device as claimed in claim 1, wherein the first substrate further comprises a second drive transistor and a second capacitance, and the second drive transistor comprises a gate end, a second end, and a third end, wherein the second end of the second drive transistor is electrically connected to the second capacitance and one of the first light-emitting units.

14. The display device as claimed in claim 1, wherein the first display unit further comprises:
   a first display-switching controller configured to enable the first light-emitting units in sequence in a first enable direction; and
   a second display-switching controller configured to enable the first light-emitting units in sequence in a second enable direction.

15. The display device as claimed in claim 14, wherein the second display unit further comprises:
   an another first display-switching controller configured to enable the second light-emitting units in sequence in the first enable direction; and
   an another second display-switching controller configured to enable the second light-emitting units in sequence in the second enable direction.

16. A driving method of a display device, comprising:
   providing a first display unit, wherein the first display unit comprises a first side; a second side opposite to the first side; a first active display area for displaying images located between the first side and the second side; a plurality of first drive transistors disposed in the first active display area; a plurality of first light-emitting units disposed in the first active display area; and a first circuit board disposed on the first side; and
   providing a second display unit, wherein the second display unit comprises a third side adjacent to the second side; a fourth side opposite to the third side; a second active display area for displaying images located between the third side and the fourth side; a plurality of second drive transistors disposed in the second active display area; a plurality of second light-emitting units disposed in the second active display area; and a second circuit board disposed on the fourth side;
   wherein the first drive transistors are enabled from the second side to the first side in sequence, and the second drive transistors are enabled from the fourth side to the third side in sequence;
   wherein the first display unit further comprises a first gate driver circuit disposed on the first active display area, and the second display unit further comprises a second gate driver circuit disposed on a second gate driver circuit in the second active display area.

17. The driving method of a display device as claimed in claim 16, wherein the first display unit further comprises a first through hole, the second display unit further comprises a second through hole, the first gate driver circuit is electrically connected to the first circuit board via the first through hole, and the second gate driver circuit is electrically connected to the second circuit board via the second through hole.

18. The driving method of a display device as claimed in claim 16, further comprising cutting a first cutting portion connected to the first active display area, wherein the first display unit further comprises a first test circuit disposed on the first cutting portion and electrically connected to the first drive transistors.

19. The driving method of a display device as claimed in claim 18, further comprising cutting a second cutting portion connected to the second active display area, wherein the second display unit further comprises a second test circuit disposed on the second cutting portion and electrically connected to the second drive transistors.

* * * * *